United States Patent [19]

Capek

[11] Patent Number: 4,559,506
[45] Date of Patent: Dec. 17, 1985

[54] TEMPERATURE COMPENSATED COAXIAL CABLE ISOLATOR

[75] Inventor: Raymond G. Capek, Elmhurst, Ill.

[73] Assignee: Zenith Electronics Corporation, Glenview, Ill.

[21] Appl. No.: 628,005

[22] Filed: Jul. 5, 1984

[51] Int. Cl.[4] ...................... H03H 7/01; H01P 1/202; H01P 5/02

[52] U.S. Cl. .................................... 333/181; 333/12; 333/24 C; 333/206

[58] Field of Search ......... 333/12, 13, 17 L, 181–185, 333/206–207, 245, 260, 167, 24 C; 334/85; 361/274, 282

[56] References Cited

U.S. PATENT DOCUMENTS 4,399,419 8/1983 Dobrovolny ...................... 333/206

OTHER PUBLICATIONS

Susskind—"The Encyclopedia of Electronics", Reinhold Publishing Co., New York, 1962; pp. 96–97.

Primary Examiner—Marvin L. Nussbaum

[57] ABSTRACT

A coaxial cable isolator includes a stepped diameter tubular outer conductive element and a threaded smaller diameter inner conductive element coaxially aligned therewith to form an interruption. A ceramic structure is positioned in the interruption and includes three ceramic capacitive elements, each having a different temperature coefficient selected to provide a minimum of 3.8 and maximum of 5.0 nanofarads of capacitance over the 0 degree Centigrade to +45 degree Centigrade operating temperature range of the isolator. Two ferrite elements for EMI absorption are sandwiched between the three capacitive elements.

6 Claims, 4 Drawing Figures

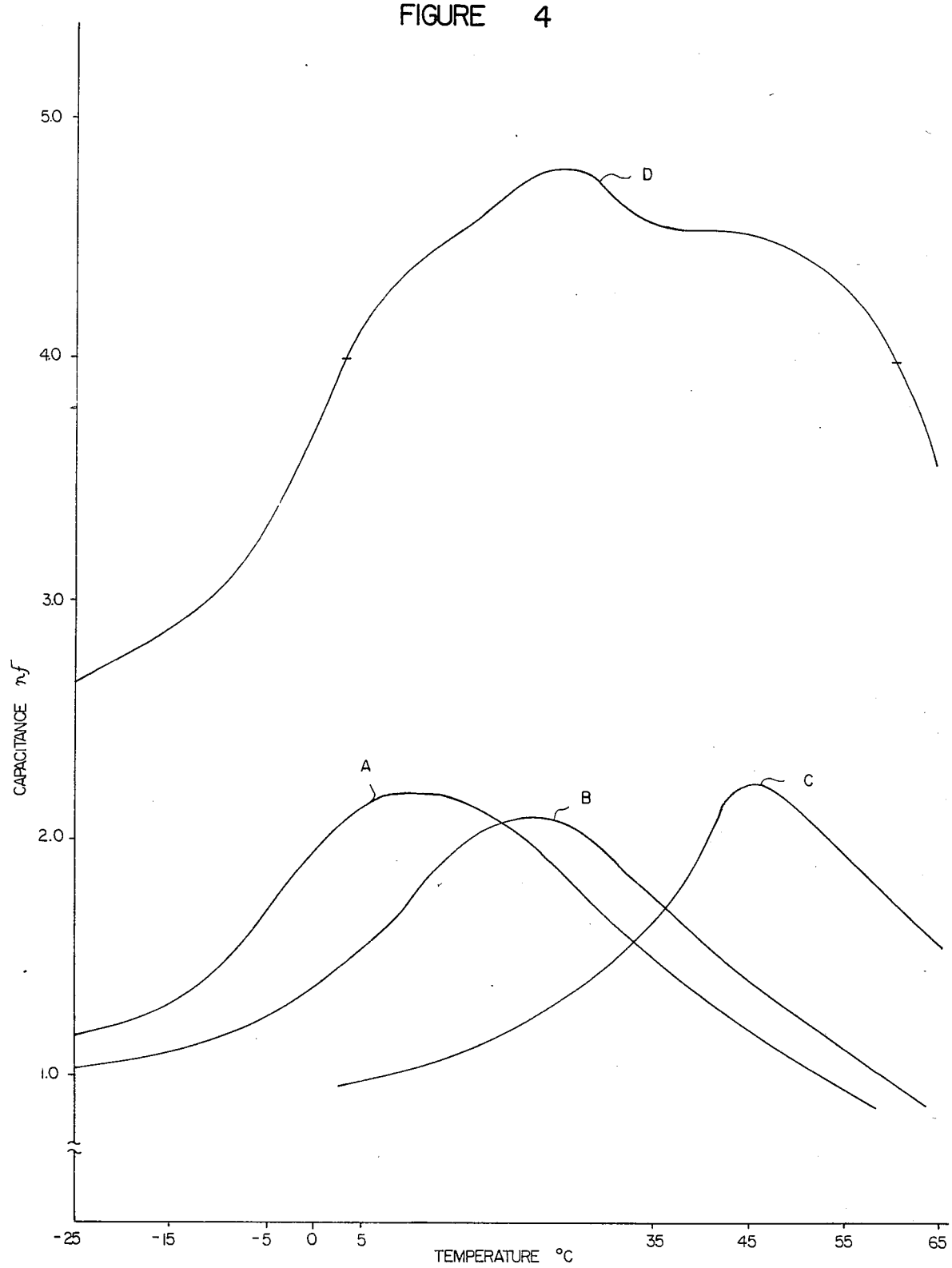

TEMPERATURE COMPENSATED COAXIAL CABLE ISOLATOR

FIELD OF THE INVENTION

This invention relates generally to coaxial cable isolators and particularly to coaxial cable isolators for use in power line voltage applications.

BACKGROUND OF THE INVENTION AND PRIOR ART

Coaxial cable isolators, for providing an interruption or gap in the ground conductor between a user apparatus and an incoming cable ground, are well known in the art. Specifically, U.S. Pat. No. 4,399,419 to P. Dobrovolny and assigned to the assignee of the present invention includes a plurality of disc-shaped ceramic capacitors and ferrites. The capacitive elements had values selected to enable coupling of television signals while blocking direct current and 120 V 60 Hz low frequency power currents. Since the outer ground conductor is interrupted, the isolator is subject to electromagnetic interference (EMI) and the ferrites are used to absorb any such energy that enters the interruption. Coaxial cable isolators of this type have been well received.

The value of the capacitance exhibited by the capacitive elements should be as large as possible to maximize television signal coupling and yet not be so large as to pose safety problems. Also, the isolator ideally should be physically small to enable it to fit into a device, such as an amplifier, and should also exhibit a small capacitance to limit signal leakage, obviously somewhat incompatible requirements. High dielectric constant capacitors, such as those produced from titanate ceramics, have proven useful for such applications. A serious drawback is that the higher the dielectric constant of the titanate formulation, the greater the capacitance temperature coefficient and hence the greater the change in exhibited capacitance with temperature change and the more nonlinear the temperature coefficient is. There has long been a need to obtain a high dielectric constant ceramic formulation that has a minimum temperature dependence. The temperature coefficient of the ceramic is mainly a function of formulation, but is also dependent upon firing temperature.

In the United Kingdom a maximum limit of 5 nonofarads is specified for a 75 ohm coaxial cable isolator. It will be recalled that in the United Kingdom, as in many foreign countries, residential power is supplied at 240 volts rather than at 120 volts as in the United States. Consequently, the capacitance value of the isolator should be lower for safety reasons. Yet, for effective EMI attenuation, the lower limit of capacitance is about 3.8 nanofarad. When the range of environmental temperature to which the isolator is subject, and the large nonlinear temperature coefficient of a high dielectric constant material are considered, many problems are manifest. For a normal outdoor temperature of −15 degrees Centigrade to 40 degrees Centigrade, the capacitance presented by high dielectric constant materials is often too low to provide adequate signal coupling. On the other hand, adding capacitive elements results in too much capacitance at certain temperatures within the operating temperature range of the isolator.

In U.S. Pat. No. 3,549,415 issued to R. Capek and J. Mazintas and assigned to the assignee of the present invention a method of making a multilayer ceramic capacitor is described. In that patent a capacitor includes a plurality of ceramic layers or wafers separated by conductive plates that are alternately connected together to form end leads. The dielectric materials of the wafers are individually selected, based upon their temperature coefficients, to produce a more linear temperature coefficient for the capacitor. That invention involved calcining the thin, flat wafers before sintering to prevent material diffusion between wafers. Diffusion during sintering apparently generated chemical-like reactions that caused substantially different solid solutions, in which the temperature coefficient of the resulting ceramic was no longer related to the ingredient's proportions. The separate precalcining of the ferroelectric wafers precluded diffusion between the layers during sintering.

Thus, the concept of making a multilayer capacitor comprising dielectric materials of different temperature coefficient to achieve a more linear composite temperature coefficient for the capacitor is known. The patented multilayer capacitor was approximately 0.75 inch by 0.1 inch by 0.5 inch and included 6 to 12 layers, with each layer varying from about 0.002 inch to 0.015 inch. An average layer thickness, for low voltage circuits, was about 0.006 inch. The specified temperature range of 25 degrees Centigrade to 120 degrees Centigrade is significantly higher than that under present consideration and no indication of making disc-shaped or tubular capacitors is given.

This prior art method of making a temperature compensated capacitor is difficult and is generally inadequate for use in connection with a tubular coaxial cable isolator, especially one that is subjected to large working voltages, such as 240 volts and to test voltages 1180 volts AC or 2180 volts DC.

OBJECTS OF THE INVENTION

Accordingly, a principal object of the invention is to provide an improved coaxial cable isolator.

Another object of the invention is to provide a small coaxial isolator that provides substantially uniform capacitance for television signal coupling over a substantial temperature range.

SUMMARY OF THE INVENTION

In accordance with the invention, a temperature compensated coaxial cable isolator for couping television signals while blocking low frequency power currents includes an interrupted outer ground conductor. Capacitive television signal coupling means and EMI absorption means are positioned in the interruption. A plurality of individual capacitive elements make up the capacitive television coupling means, with the elements having temperature coefficients selected to exhibit a total capacitance in the range of 3.8 to 5 nanofarads over a temperature range of about 0 degrees Centigrade to +45 degrees Centigrade.

BRIEF DESCRIPTION OF THE DRAWINGS

Further objects and advantages of the invention will be apparent upon reading the following description in conjunction with the drawings in which:

FIG. 4 is a set of curves showing the composite capacitance and the individual capacitance exhibited by the capacitive elements.

DESCRIPTION OF THE PREFERRED EMBODIMENT

Figure 1:
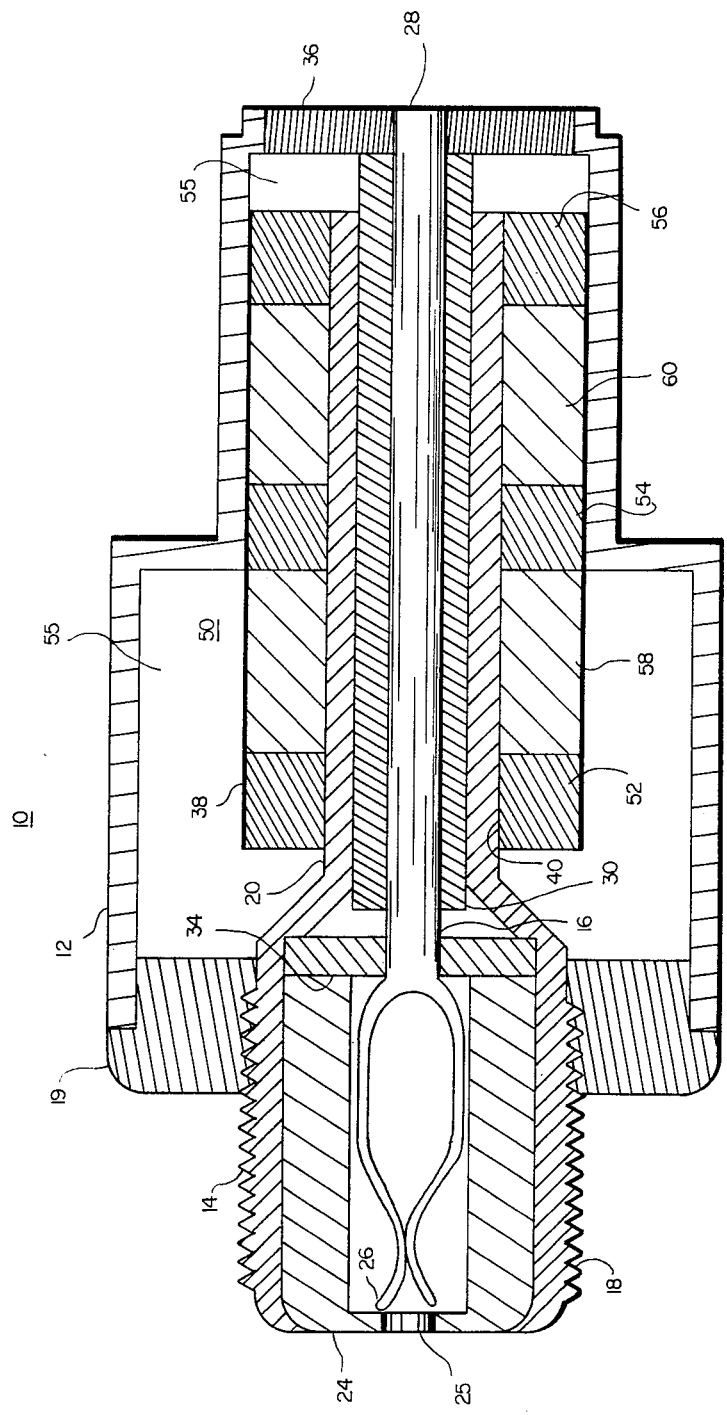
FIG. 1 is a cross sectional view of a coaxial cable isolator constructed in accordance with the invention.

FIG. 1 shows an isolator 10 including a first outer conductive element 12 of stepped cylindrical configuration, a second outer conductive element 14 and an inner conductive element 16. Second outer conductive element 14 has a threaded end 18, adapted to receive a standard coaxial cable connector, and a small diameter tubular portion 20 and is concentrically arranged with respect to first outer conductive element 12. A large annular insulator 19 is positioned in the gap or interruption between conductive elements 12 and 14. It will be recognized that this gap remains even when a suitable metallic connector is affixed to threaded end 18. Hence the isolator is exposed to EMI. Inner conductive element 16 has a tubular contact tail 28 at one end and a pair of spring contacts 26 at its other end. Contact tail 28 may be adapted to accept an appropriate center conductor from a coaxial cable or to connect to a suitable wire for connection in a circuit. Spring contacts 26 are adapted to resiliently open upon insertion therein of an appropriate mating plug (not shown) for making electrical contact thereto. The spring contacts are confined in an end insulator 24 defining a centrally located aperture 25 of slightly greater diameter than the mating plug. The contact tail of inner conductive element 16 is surrounded by a tubular insulator 30 which concentrically supports inner conductive element 16 in tubular portion 20. The end of contact tail 28 is supported in an end insulator 36 which closes the circular opening in the small diameter end of first outer conductive element 12. The other end of contact tail 28 is supported by an annular insulator 34. In use, this end of outer conductive element 12 is not subject to EMI intrusion.

A tubular-shaped ceramic structure 50 has an inner opening in which tubular portion 20 is supported and an outer surface in contact with the inside of the small diameter end of first outer conductive element 12. Ceramic structure 50 is made up of three disc-shaped capacitive elements 52, 54 and 56 with disc-shaped ferrite elements 58 and 60 sandwiched therebetween. A metal sheath 38 or other suitable conductive element surrounds the outer surface of ceramic structure 50. The inner surface of ceramic structure 50 is preferably metal plated to make it conductive. This is illustrated by metallized area 40. Thus, capacitive elements 52, 54 and 56 are connected in parallel between metal sheath 38 and metallized area 40. The capacitance values of the individual elements are therefore added to arrive at the total capacitance in the interruption of the ground element.

Thus it is seen that the connection of metal sheath 38 to the inner surface of first outer conductive element 12 and the connection of metallized area 40 to the tubular portion 20 of the second outer conductive element 14, electrically connects ceramic structure 50 between the first and second outer conductive elements. As mentioned above, ferrite elements 58 and 60 serve to absorb any EMI which enters the interruption in the outer ground element of the isolator. The open spaces in the isolator may be filled with an epoxy type material indicated by reference numerals 55.

The temperature coefficients of capacitive elements 52, 54 and 56 are selected such that the total capacitance exhibited by the capacitive elements remains within predetermined limits over the operating temperature range of the isolator.

Figure 2:
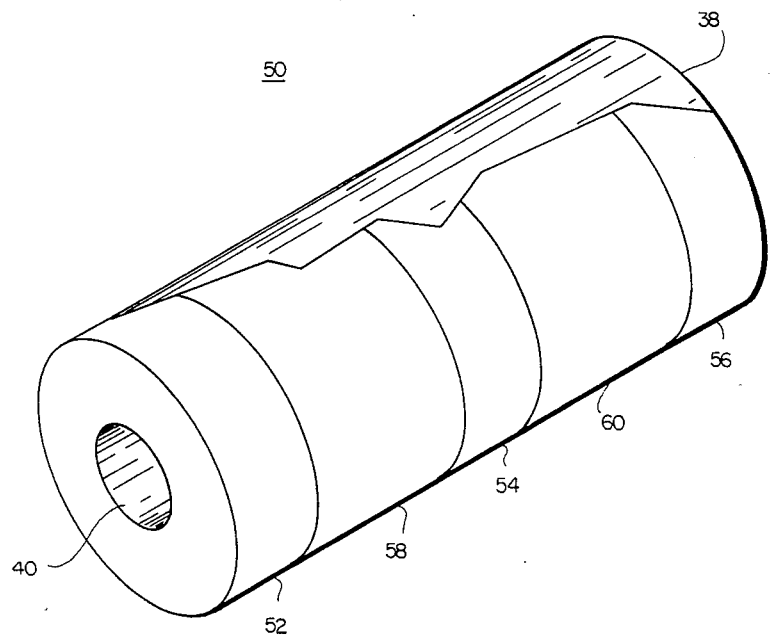
FIG. 2 is a perspective view of the capacitive and ferrite elements of the isolator.

In FIG. 2, the perspective view of ceramic structure 50 clearly shows the arrangement of the disc-shaped capacitive elements 52, 54 and 56 and the sandwiched ferrite elements 58 and 60. A partially cut away view of metal sheath 38 is also shown. The inner metallized area 40 is indicated in the inner opening of ceramic structure 50.

Figure 3:
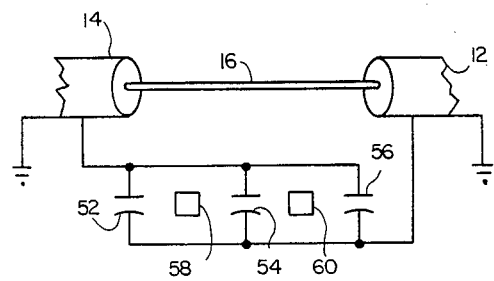
FIG. 3 is an electrical diagram of the outer ground conductor.

In FIG. 3 the electrical diagram of the interrupted outer conductive element is shown. Specifically, capacitive elements 52, 54 and 56 are connected in parallel between the grounded first and second outer conductive elements 12 and 14, respectively. The EMI absorbing ferrite elements 58 and 60 are shown between the capacitive elements.

The curves of FIG. 4 illustrate the individual capacitance exhibited by capacitive elements 52, 54 and 56, with curve A corresponding to element 52, curve B to element 54, and curve C to element 56. Over the temperature range of interest, namely from 0 degrees Centigrade to +45 degrees Centigrade, the capacitive elements exhibit a substantial variation in capacitance. It will be appreciated that these curves of the capacitance of the capacitive elements will have the same shapes as the curves illustrating the temperature coefficients of the dielectric material of the same capacitive elements because of the linear relationship between dielectric constant and capacitance. These temperature coefficients are selected so that the peak of one of the capacitive elements is at approximately 5 degrees Centigrade, the peak of the other element is at approximately 25 degrees Centigrade and the peak of the third element is at approximately 45 degrees Centigrade. With this selection, the composite capacitance curve D is seen to have a minimum value of about 3.8 nanofarads and a maximum value of about 4.8 nanofarads between 0 degrees Centigrade and 60 degrees Centigrade. Consequently, the ceramic structure constructed with these type capacitive elements will retain sufficient capacitance over the environmental or operating temperature range to enable adequate television signal coupling without exceeding the maximum 5 nanofarads capacitance safety limit established in some foreign countries.

The disc-shaped capacitive element dimensions are 0.183 inch for the inner diameter, 0.324 inch for the outer diameter and 0.115 inch in length. The dimensions of the ferrite elements are not critical.

With the invention, a small tubular-shaped ceramic capacitor structure may be readily fabricated to exhibit a relatively linear temperature coefficient over a substantial temperature range. Further, the ceramic materials are of conventional barium titanate, fired to approximately 2350 degrees Fahrenheit and selected to exhibit peaks in their temperature coefficient characteristic curves at respectively 5 degrees Centigrade, 25 degrees Centigrade and 45 degrees Centigrade. These capacitive elements are readily fabricated and reproducible and enable mass production of temperature compensated coaxial cable isolators which permit adequate television signal coupling over an extreme of temperatures while exhibiting low signal leakage and a maximum capacitance to preclude safety problems, even in areas where 240 volts household power is used.

What has been described is a novel coaxial isolator that is temperature compensated and which solves many of the problems of the prior art. It is recognized that numerous changes in the described embodiments of the invention will be apparent to those skilled in the art without departing from its true spirit. The invention is to be limited only as defined in the claims.

What is claimed is:

1. A temperature compensated coaxial isolator for coupling television signals while blocking low frequency power currents comprising:
    an outer ground conductor having an interruption therein;
    capacitive signal coupling means and EMI absorption means in the interruption;
    a plurality of individual capacitive elements in said capacitive signal coupling means; and
    said individual capacitive elements having temperature coefficients selected to exhibit a capacitance substantially in the range of 3.8 to 5 nanofarads over a temperature variation from about 0 degrees Centigrade to +45 degrees Centigrade.

2. The isolator of claim 1 wherein there are three capacitive elements, each of substantially annular disc configuration, with conductive surfaces connected in said interruption between isolated portions of said outer ground conductor.

3. The isolator of claim 2 wherein said EMI absorption means includes annular disc-shaped ferrites interposed between adjacent ones of said capacitive elements.

4. The isolator of claim 3 wherein said outer ground conductor includes a first tubular element of small diameter engaging the inner one of said conductive surfaces of said capacitive elements and a second tubular element of larger diameter engaging the outer one of said conductive surfaces of said capacitive elements.

5. The isolator of claim 4 wherein said capacitive elements exhibit peaks in their respective temperature coefficient curves at substantially 5 degrees Centigrade, 25 degrees Centigrade and 45 degrees Centigrade.

6. A temperature compensated coaxial cable isolator for coupling television signals while blocking DC and low frequency power currents comprising:
    an outer ground conductor having first and second portions that are electrically isolated by a gap;
    three ceramic capacitive elements and two interleaved ferrite EMI absorption elements positioned in said gap;
    each said capacitive element having a temperature coefficient characteristic selected to cooperate with the temperature coefficient characteristics of said other two capacitive elements to produce a capacitance of no less than 3.8 nanofarads and no more than 5.0 nanofarads over temperatures from substantially 0 degrees Centigrade to +45 degrees Centigrade, said capacitive elements and said ferrite elements having a generally tubular configuration with the inner and outer surfaces thereof being connected electrically to said first and said second portions respectively.

* * * * *